United States Patent
Ogura

(10) Patent No.: US 7,515,622 B2
(45) Date of Patent: Apr. 7, 2009

(54) QUANTUM NANOSTRUCTURE SEMICONDUCTOR LASER

(75) Inventor: Mutsuo Ogura, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 172 days.

(21) Appl. No.: 11/088,900

(22) Filed: Mar. 25, 2005

(65) Prior Publication Data

US 2006/0050753 A1   Mar. 9, 2006

(30) Foreign Application Priority Data

Sep. 7, 2004   (JP)   ............................... 2004-259369

(51) Int. Cl.
  *H01S 5/00*   (2006.01)
(52) U.S. Cl. ............................... 372/46.01; 372/46.012; 372/45.01
(58) Field of Classification Search ............... 372/46.01
  See application file for complete search history.

(56) References Cited

U.S. PATENT DOCUMENTS

| | | | | |
|---|---|---|---|---|
| 4,447,904 | A | * | 5/1984 | Burnham ................. 372/45.01 |
| 5,280,493 | A | * | 1/1994 | Takiguchi et al. ........ 372/45.01 |
| 5,459,747 | A | * | 10/1995 | Takiguchi et al. ........ 372/50.11 |
| 5,548,607 | A | * | 8/1996 | Tsang ..................... 372/50.11 |
| 5,684,823 | A | * | 11/1997 | Goto et al. .................... 372/96 |
| 5,717,710 | A | * | 2/1998 | Miyazaki et al. ......... 372/50.11 |
| 2003/0128729 | A1 | * | 7/2003 | Matsumura ................... 372/46 |

FOREIGN PATENT DOCUMENTS

| | | | |
|---|---|---|---|
| JP | 58057771 | A * | 4/1983 |
| JP | 62165989 | A * | 7/1987 |
| JP | 5-55692 | | 8/1993 |
| JP | 7-32279 | | 4/1995 |
| JP | 7-114307 | | 12/1995 |
| JP | 2716693 | | 11/1997 |
| JP | 2817602 | | 8/1998 |

(Continued)

OTHER PUBLICATIONS

P. K. York, et al., "MOCVD regrowth over GaAs/AlGaAs gratings for high power long-lived InGaAs/ AlGaAs lasers", Journal of Crystal Growth, vol. 124, 1992, pp. 709-715.

(Continued)

*Primary Examiner*—Minsun Harvey
*Assistant Examiner*—Sean Hagan
(74) *Attorney, Agent, or Firm*—Oblon, Spivak, McClelland, Maier & Neustadt, P.C.

(57) ABSTRACT

A quantum nanostructure semiconductor laser includes a strip-shaped ridge with a plurality of V-grooves formed on a compound semiconductor substrate in the direction of laser beam emission, with the V-grooves arrayed in parallel and with each V-groove extending orthogonally to the direction of laser beam emission. On the ridge, an optical waveguide is provided that includes a lower cladding layer, a plurality of quantum wires, and an upper cladding layer. The quantum wires are formed to a finite length corresponding to the stripe width of the laser beam, and are each located at a position corresponding to a V-groove location. The optical waveguide is trapezoidal in shape. The quantum wires do not project out beyond the width of the ridge, but the ends of the wires are converged and closed off with the upper and lower cladding layers toward higher index crystalline planes.

4 Claims, 9 Drawing Sheets

FOREIGN PATENT DOCUMENTS

| | | |
|---|---|---|
| JP | 3338869 | 8/2002 |
| JP | 2003-234543 | 8/2003 |
| JP | 2003-243774 | 8/2003 |
| JP | 3536978 | 3/2004 |

OTHER PUBLICATIONS

Haruhisa Soda, et al., "Stability in Single Longitudinal Mode Operation in GaInAsP/InP Phase-Adjusted DFB Lasers", IEEE Journal of Quantum Electronics, vol. QE-23, No. 6, Jun. 1987, pp. 804-814.

S. Yang, et al., "Enhanced Performance of Uncooled Strongly-Gain-Coupled MQW DFB lasers in 10 Gb/s Link Applications", Proceedings, 27th European Conference on Optical Communications, vol. 2, 2001, 3 cover pages, pp. 124 and 125.

Hideaki Koizumi, et al., "Observation for Mind and the Brain: Noninvasive Higher-order Brain-Function Imaging", Journal of the Institute of Electrical Communication Engineers of Japan, vol. 87, No. 3, 2004, pp. 207-214.

\* cited by examiner

QUANTUM NANOSTRUCTURE SEMICONDUCTOR LASER

BACKGROUND OF INVENTION

1. Field of the Invention

The present invention relates to an improved quantum nanostructure semiconductor laser that is particularly suited for application to distributed feedback (DFB) semiconductor lasers.

2. Description of the Prior Art

Distributed feedback semiconductor lasers provided with a periodic gain or refractive index structure along the waveguide, are important in future wavelength multiplex communication systems due to the fact that it is possible to closely control their lasing wavelength and that they can readily be integrated since, unlike in the case of a Fabry-Perot laser, they do not require a cleaving step.

For future progress, the manufacturing process has to be simplified. In the conventional fabrication techniques, as described for example in "MOCVD regrowth over GaAs/AlGaAs gratings for high power long-lived InGaAs/AlGaAs lasers," P. K. York, J. C. Connolly, et al., Journal of Crystal Growth 124 (1992) pp 709-715 (Reference 1), fabrication comprised forming a lower cladding layer on the substrate, followed by a lower guide layer, an active layer and an upper guide layer in a first crystal growth process, then forming the guide layer with a grating corresponding to the integer multiples of a quarter wavelength in the waveguide, then using a separate, second crystal growth step to form an upper cladding layer on the guide layer having a periodic structure.

In order to obtain a lateral confinement effect, in addition to these basic steps, a stripe was formed along the optical waveguide by etching or the like, using a mask of silicon dioxide or the like, a third growth step was used to form a current blocking layer buried in the sidewall of the stripe, and then the silicon dioxide mask used for the selective growth was removed and a fourth growth step used to form ohmic contacts and to planarize the structure.

However, the use of multiple lithography and crystal growth steps steeply increased the manufacturing cost, preventing it becoming widespread on an industrial scale. Moreover, recombination current was increased due to the regrowth interface being in the vicinity of the active layer, causing an increase in the threshold current. Thus, fundamentally there were limits to the technique, making it inapplicable, without modification, on a continuing basis into the future.

On the other hand, quantum nanostructure semiconductor lasers using quantum wires or quantum dots in the active region are suitable for realizing high-performance optical devices since the density of the states of the electron systems is concentrated at specific energy levels. There were also found to be other merits in addition to the initially-projected quantum effect. In the case of a quantum dot, for example, because the dot is surrounded by wide bandgap material, carriers can be confined inside the dot regardless of device configuration, making it possible to pursue the addition of functions without increasing the manufacturing cost, by just modifying the crystal growth conditions. With respect also to high-speed modulation, stable lasing properties can be predicted since the spatial movement of carriers is suppressed.

Generally, however, in order to realize stable, high-speed modulation, optical gain ratio in the main lasing mode to that in the side mode (the side mode suppression ratio) has to be large. In the case of conventional index-coupled distributed feedback lasers in which there are two equal longitudinal modes, a phase-shifted DFB laser has been devised by providing in the resonator center a phase shifter, the wavelength in which corresponds to ¼ the wavelength in the lasing medium.

However, index-coupled distributed feedback lasers produce an optical intensity distribution along the direction of the resonator, and as described in "Stability in Single Longitudinal Mode Operation in GaInAsP/InP Phase-Adjusted DFB Lasers," Haruhisa Soda, et al., IEEE Journal of Quantum Electronics, Vol. QE-23, No. 6, June 1987 (Reference 2), lasing mode instability caused by spatial hole burning becomes a problem.

On the other hand, in the case of gain-modulated DFB lasers, only one lasing mode is possible and there is no intensity distribution along the resonator direction, so that, as recognized in, for example, "Enhanced Performance of Uncooled Strongly-Gain-Coupled MQW DFB lasers in 10 Gb/s Link Applications," S. Yang, et al., ECOC 2001 Proceedings, 27th European Conference on Optical Communication, Vol. 2, pp 124-125 (2001) (Reference 3), a good-quality dynamic single-mode can be obtained. Stabilizing the main lasing mode and simplifying the manufacturing process will be very promising with respect to the construction of semiconductor lasers and the like for the widespread implementation of fiber to the home.

It would be best if the high-density, uniform integration of quantum wires and quantum dots in a positional relationship, based on specific rules, could be achieved with one-time crystal growth. That would make it possible to rationally realize wavelength-stabilized semiconductor laser modules and semiconductor saturable absorbers required for self-starting of ultrafast solid-state lasers.

However, the upper and lower cladding layers have to be at least 0.5 to 1 μm thick to confine the light in the optical waveguide. Thus, if, after the grating has been formed on the substrate and a lower cladding layer of that thickness has been formed, it were possible to maintain a satisfactory grating configuration on the surface of the lower cladding layer, it would be possible to form an active layer adjacent to the cladding layer grating using one-time crystal growth, markedly simplifying the process of manufacturing distributed feedback semiconductor lasers.

Based on this thinking, in Japanese Patent No. 3536978 (Reference 4) the present inventors disclosed a technology for growing V-grooves 1 μm or more in the thickness direction while maintaining a good shape by setting the initial shape of the compound semiconductor substrate and a crystal growth temperature suitable for the composition ratio of the epitaxial layer. By using this technology, the inventors were able to use one-time MOCVD to form a periodic structure comprised of quantum wires disposed orthogonally to the semiconductor waveguide at periods that were integer multiples of ¼ the wavelength in the lasing medium, making it possible to realize a gain-coupled DFB laser in which mode competition could not readily occur.

Moreover, while not yet public knowledge at the time of the present patent application, in Patent Application No. 2002-51548 (Reference 5) the present inventors realized a structure in which both ends of quantum wires were confined using a one-time growth process, by forming quantum wires having a finite-length corresponding to the stripe width of the semiconductor laser. The problem of carrier leakage along the wires outside the optical resonator in the case of the usual quantum wire formation orthogonal to the optical waveguide could be resolved, in accordance with the technology disclosed by the application, to use cladding layers to enclose the ends of the quantum wires. The finite-length quantum wires satisfy the carrier confinement effects like quantum dots, while at the same time, polarization and position controllability which is inherent from the original infinite-length quantum wires.

There have been many reports relating to forming an optical waveguide structure and current blocking structure by the least possible number of crystal growth steps to achieve the goal of simplifying the fabrication process and lowering the threshold current. In Japanese Patent No. 2716693 (Reference 6), for example, in the selective MOCVD growth on a ridge substrate, the fact that the growth rate of higher-order planes formed on sidewalls is slower than the growth rate on the substrate (100) plane was utilized for one-time growth formation of a buried Fabry-Perot laser. Also, in Japanese Patent No. 2081665 (Reference 7), the present inventors disclosed a technology for forming a quasi-buried Fabry-Perot laser by using a dielectric window to limit the growth region.

It is possible to use a ridge substrate to form a buried heterostructure such as is disclosed in Reference 6, but it is difficult to suppress current feeding through the current blocking layers due to the thyristor effect. This can be improved such as by providing a p-type current blocking layer beforehand on an n-type substrate, as recognized in JP-B HEI 05-55692 (Reference 8), and by holding down the concentration of the n-type blocking layers, as in JP-A 2003-234543 (Reference 9), and selectively diffusing the cap layer stripe portion and forming a p-type high-concentration contact layer. In the future, high-speed modulation characteristics will be important, for which it will be important to reduce parasitic capacitance. For this, JP-A 2003-243774 (Reference 10) discloses a technology in which films of oxidized AlAs are used for current blocking.

However, the techniques disclosed in the references described in the above are undesirable in that they complicate the device manufacturing process. Using regrowth to form a current blocking structure on sidewalls requires extra work and trouble. Even in the case of the technique disclosed by Reference 5, as a further development of Reference 4, which would seem to be the most desirable at this point in time, it is difficult to control the etch depth used to form the ridge waveguide after the crystal growth, making it difficult to obtain reproducibility of the characteristics.

The object of the present invention is to provide a quantum nanostructure semiconductor laser having a low threshold current and stable lasing wavelength with simple and reproducible processing steps, using one-time crystal growth on a non-planer substrate to form an optical waveguide and a current blocking structure having a high current blocking effect.

SUMMARY OF THE INVENTION

To attain the above object, the present invention provides a quantum nanostructure semiconductor laser comprising a stripe-shaped ridge having a plurality of V-grooves formed on a compound semiconductor substrate in a direction of laser beam emission, the V-grooves being arrayed in parallel along a surface of the ridge in the direction of laser beam emission with each V-groove extending orthogonally to the direction of laser beam emission, an optical waveguide on the ridge that includes a lower cladding layer, a plurality of quantum wires and an upper cladding layer formed in order by a one-time crystal growth process, each of the plurality of quantum wires being formed to a finite length corresponding to a stripe width of a laser beam emission at a location corresponding to a V-groove location to constitute a laser active region, the optical waveguide having a trapezoidal shape and wherein the quantum wires do not project out beyond a width of the ridge, but ends of the quantum wires are converged and closed off with the upper and lower cladding layers toward higher index crystalline planes to provide a high lateral confinement offset.

For manufacturing convenience and for advantageousness in the crystal growth, the ridge structure can be a reverse mesa in shape. Also, with respect to the ridge height, the crystal growth is not limited to being on the ridge; instead, a layered structure is simultaneously grown on the compound semiconductor substrate around the ridge using the same materials used to form the layered structure that includes the lower cladding layer, laser active region and upper cladding layer, with the height of the upper surface of the layered structure formed around the ridge not exceeding the height of the lower cladding layer formed on the ridge.

The above object is also attained by a quantum nanostructure semiconductor laser comprising a stripe-shaped window that exposes a compound semiconductor layer and extends in a direction of laser beam emission, the window being formed in a dielectric layer formed on a compound semiconductor substrate, a plurality of V-grooves on a compound semiconductor substrate surface exposed by the window, the V-grooves being arrayed in parallel along a surface of the ridge in the direction of laser beam emission with each V-groove extending orthogonally to the direction of laser beam emission, an optical waveguide on the plurality of V-grooves exposed by the window that includes a lower cladding layer, a plurality of quantum wires and an upper cladding layer formed in order by a one-time crystal growth process, each of the plurality of quantum wires being formed to a finite length corresponding to a stripe width of a laser beam emission at a location corresponding to a V-groove location to constitute a laser active region, the optical waveguide having a trapezoidal shape and wherein the quantum wires do not project out beyond a width of the ridge, but ends of the quantum wires are converged and closed off with the upper and lower cladding layers toward higher index crystalline planes to provide a high lateral confinement offset.

In addition to this configuration, the ends of the quantum wires can be located in the optical waveguide to thereby be substantially completely covered by the upper and lower cladding layers, or the ends of the quantum wires can be converged and closed off, like the bow of a boat.

The above object is also attained by a quantum nanostructure semiconductor laser comprising a stripe-shaped ridge having a plurality of V-grooves formed on a compound semiconductor substrate in a direction of laser beam emission, the V-grooves being arrayed in parallel along a surface of the ridge in the direction of laser beam emission with each V-groove extending orthogonally to the direction of laser beam emission, an optical waveguide on the ridge that includes a lower cladding layer, a plurality of quantum dots grown to or above a critical film thickness and an upper cladding layer formed in order by a one-time crystal growth process, each of the plurality of quantum dots being formed at a location corresponding to a V-groove location, the quantum dots within a location corresponding to each V-groove combining to constitute a laser active region for laser beam emission, the optical waveguide having a trapezoidal shape and wherein the quantum wires do not project out beyond a width of the ridge, but ends of the quantum wires are converged and closed off with the upper and lower cladding layers toward higher index crystalline planes to provide a high lateral confinement offset. The above-described limitations relating to ridge shape and height can also be invoked in the case of this configuration.

The above object is also attained by a quantum nanostructure semiconductor laser comprising a stripe-shaped window that exposes a compound semiconductor layer and extends in a direction of laser beam emission, the window being formed in a dielectric layer formed on a compound semiconductor substrate or located between dielectric layers, a plurality of V-grooves on a compound semiconductor substrate surface exposed by the window, the V-grooves being arrayed in parallel along a surface of the ridge in the direction of laser beam emission with each V-groove extending orthogonally to the direction of laser beam emission, an optical waveguide on the plurality of V-grooves exposed by the window that includes a lower cladding layer, a plurality of quantum dots grown to or above a critical film thickness and an upper cladding layer formed in order by a one-time crystal growth process, each of the plurality of quantum dots being formed at a location corresponding to V-groove bottoms, to constitute a laser active region for laser beam emission, the optical waveguide having a trapezoidal shape and wherein the quantum wires do not project out beyond a width of the ridge, but ends of the quantum wires are converged and closed off with the upper and lower cladding layers toward higher index crystalline planes to provide a high lateral confinement offset.

Examples of preferred materials may be proposed for each of the above aspects of the invention. For example, a semiconductor laser can be proposed in which the V-grooves are finite length V-grooves formed on a GaAs (100) or (311)A substrate along the [01-1] direction, the laser active region, which is to say the quantum wires or quantum dots, is fabricated from GaAs or InGaAs grown on the finite length V-grooves, and a GaAs or AlGaAs cladding region is provided to cover the quantum wires or dots. A semiconductor laser may also be proposed in which the V-grooves are finite length V-grooves formed on an InP (100) or (311)A substrate along the [01-1] direction, the quantum wires or quantum dots are fabricated from InGaAs grown on the finite length V-grooves, and an InAlAs or InP cladding region is provided to cover the quantum wires or dots.

V-grooves are usually arrayed at periods that are integer multiples of ¼ the wavelength in the lasing medium; such a semiconductor laser can be used as a gain-coupled or index-coupled DFB laser. If the periods are intentionally displaced from the integer multiples of ¼ the wavelength, it becomes possible to stabilize the waveguide mode or compensate for dispersion between lasing modes, enabling wideband wavelength emission and short-pulse emission in a mode-locked state.

The invention also includes an apparatus that applies the quantum nanostructure semiconductor laser. For example, an apparatus comprised of a quantum nanostructure semiconductor laser according to any of the above configurations in which the laser is modulated by a modulator provided at either end in the laser emission direction, or by two modulators, one at each end, would have general-purpose applicability.

The quantum nanostructure semiconductor laser according to any of the above configurations can also be used as the light source of a diffuse optical tomography apparatus. In accordance with this invention, high-density vertically and horizontally stacked multiple finite-length quantum wires or quantum dots can be formed at a desired location in the device structure of a quantum nanostructure semiconductor laser by a one-time selective growth procedure, in addition to which an optical waveguide structure required for a semiconductor laser or modulator can be realized with a very simple manufacturing process.

Moreover, since it does not have a separately-formed buried structure (the optical waveguide having a peripheral sidewall that is at least as high as the height of the active region and is exposed or covered only by an insulation layer), problems such as current leakage from the buried semiconductor (conductive) layer used in the conventional structure essentially do not arise, and there is also no thyristor effect caused by the carrier injection conditions. There is therefore no need to take the kind of countermeasures that are required in the prior art structures to deal with such problems. Parasitic capacitance is also low, making the device suitable for high-speed operation.

It also becomes easy to fabricate more advanced quantum nanostructure semiconductor lasers such as dispersion-compensated mode-locked lasers, using chirped quantum wire arrays, and significant application to wavelength division multiplexing laser arrays for optical multiplex communications, semiconductor optical modulators and various other optical functional devices can be expected.

Looking to the future, with the move toward expanding communication wavelength bands, wavelengths in the 1.0 to 1.6 μm region are becoming important. Wavelength ranges can be expanded by utilizing the present invention. Since regrowth steps are not necessary, cladding layers can be formed using the compound semiconductor containing aluminum, which has a large bandgap, thereby making it possible to manufacture lasers with a high $T_o$, meaning that operation temperature dependency of the lasing threshold current is small. This will make it possible to realize uncooled wavelength-stabilized lasers for consumer product applications in which it is difficult to precisely control temperature conditions, such as in homes and automobiles.

The quantum nanostructure semiconductor laser of this invention has a low parasitic capacitance that makes the laser unit suitable for high-speed direct modulation. The absence of a buried conductive layer makes it possible to simplify the formation of the modulator section by isolating the electrodes. Coherent, dual-wavelength modulated light can be obtained by, for example, providing a modulation region at each end of the laser emission section. Utilizing such a structure for coherent optical heterodyne detection would have the merit of eliminating the effect of low-frequency detector noise, enabling direct light components to be extracted, which is useful for imaging objects that scatter a lot of light, such as living organisms. Thus, it is also possible to utilize dual-wavelength light produced by a DFB quantum nanostructure semiconductor laser, according to this invention, equipped with a modulator, to configure a small, effective diffuse optical tomography apparatus.

Further features of the invention, its nature and various advantages will be more apparent from the accompanying drawings and following detailed description of the invention.

DESCRIPTION OF THE PREFERRED EMBODIMENT

Figure 1A:
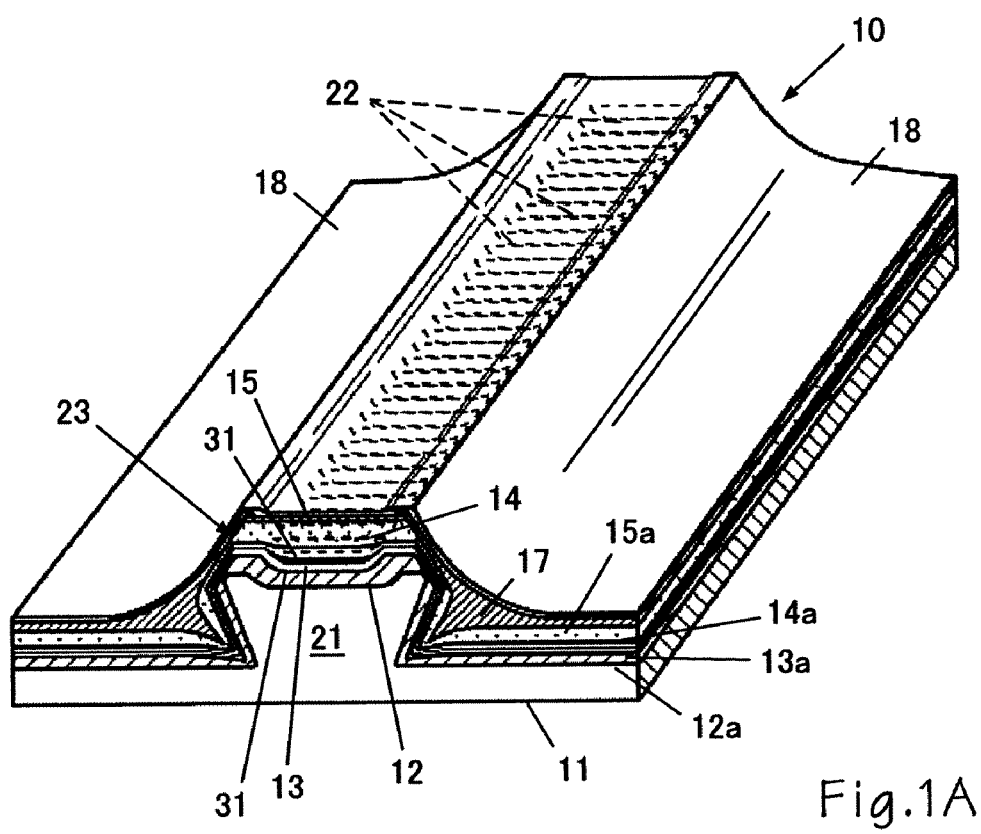
FIG. 1A is a perspective view of a quantum nanostructure semiconductor laser according to a first embodiment of this invention.
Figure 1B:
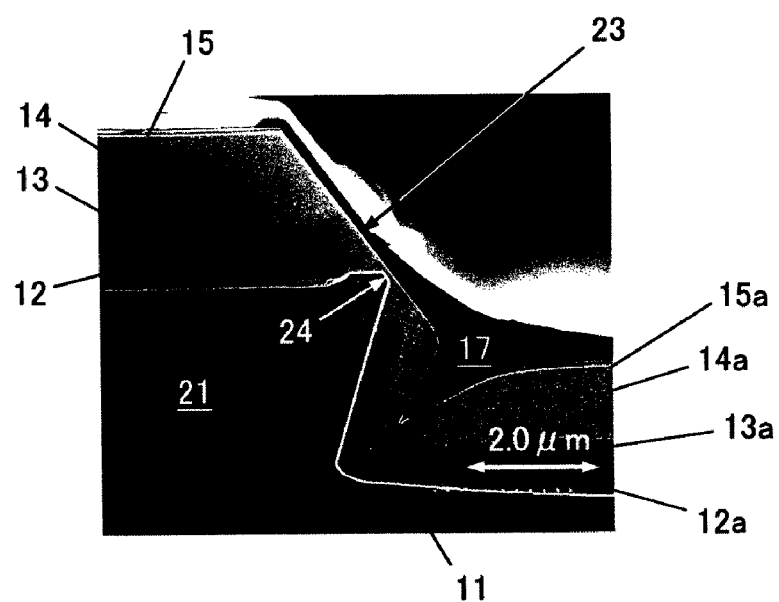
FIG. 1B is a scanning electron micrograph showing an enlarged view of the principal parts of FIG. 1A.

FIG. 1A shows the structure of a quantum nanostructure semiconductor laser that is a first preferred embodiment of the present invention, and FIG. 1B is a scanning electron micrograph showing an enlarged view of the principal portions. A compound semiconductor substrate 11 provides the overall physical and mechanical support for the device. A ridge 21 is formed on the substrate 11. The ridge 21 is formed as a stripe extending along the direction of laser beam emission, and preferably has a reverse mesa shape. A plurality of parallel V-grooves 22 is formed on the surface of the ridge 21, with each of the V-grooves 22 extending orthogonally to the lengthwise direction of the ridge 21.

A technique that is already known, such as from Reference 4, is used to epitaxially grow at least a lower cladding layer 12 on the ridge 21, which is followed by the forming of finite length quantum wires 13 at a position corresponding to the position of the V-grooves 22, an upper cladding layer 14 and a cap layer 15. For planarization and electrode isolation purposes, an insulation layer 17, which is preferably a polyimide layer, is formed on the structure. In the case of the illustrated example, a guide layer 31 is provided between each of the cladding layers 12 and 14 and the quantum wires 13. These guide layers 31 sandwiching the quantum wires 13 to enhance a lasing mode confinement is a design item that is known in the prior art.

By utilizing the known anisotropy of the crystal orientation in the growth of the layers 12 to 15 on the ridge 21 (by selective growth of a III-V compound), the optical laser waveguide structure is realized in a self-organized manner with a trapezoidal shape 23 bound by higher index crystalline planes on the ridge 21. In other words, the shape is formed by the growth of the crystal layers required to constitute the semiconductor laser and also determines the geometrical structure of the requisite optical waveguide without additional processing.

In the quantum nanostructure semiconductor laser 10 thus formed according to the present invention, it is desirable that the quantum wires 13 constituting the laser active region do not project out beyond the width of the ridge 21, but that the ends of the wires 13 are instead converged and closed off toward the higher index crystalline planes, to thereby provide a high lateral current confinement effect.

The present invention does not employ a buried structure defined by etching and regrowth processes in the prior arts. Instead, in this example, the sidewall of the trapezoidal waveguide is only covered by the polyimide insulation layer 17, unlike in the case of a conventional buried structure in which the semiconductor layers are used to provide covering. In addition to eliminating current leakage, this reduces parasitic capacitance, giving the device very good characteristics for high-speed operation.

Crystal growth is not limited to the top of the ridge 21. Instead, a layered structure is simultaneously grown on the compound semiconductor substrate 11 around the ridge 21 from the materials 12a, 13a, 14a and 15a that constitute the lower cladding layer 12, the plurality of quantum wires 13, the upper cladding layer 14 and the cap layer 15. The ridge 21 is made high enough so that the height of the upper surface of the planar structure formed around the ridge 21 does not exceed the height of the lower cladding layer formed on the ridge. In the illustrated example, the ridge 21 is high enough, with the height of the upper surface of the layered structure formed on the substrate 11 around the ridge 21 being considerably lower than the upper edge 24 of the ridge 21. Even if the ridge 21 is made much lower than shown, it is made high enough to ensure that the sidewall around the optical waveguide is not covered by the lower cladding layer 12, as in the case of a conventional buried structure. As long as another conductive layer is not allowed to cover the waveguide sidewall, the sidewall need not be covered by an insulation layer 17 but may instead be used in an exposed state.

As mentioned, the quantum nanostructure semiconductor laser 10 of this invention is manufactured by a known technique. However, for reference, an example of the manufacture of the quantum nanostructure semiconductor laser 10 is described below.

Figure 2A:
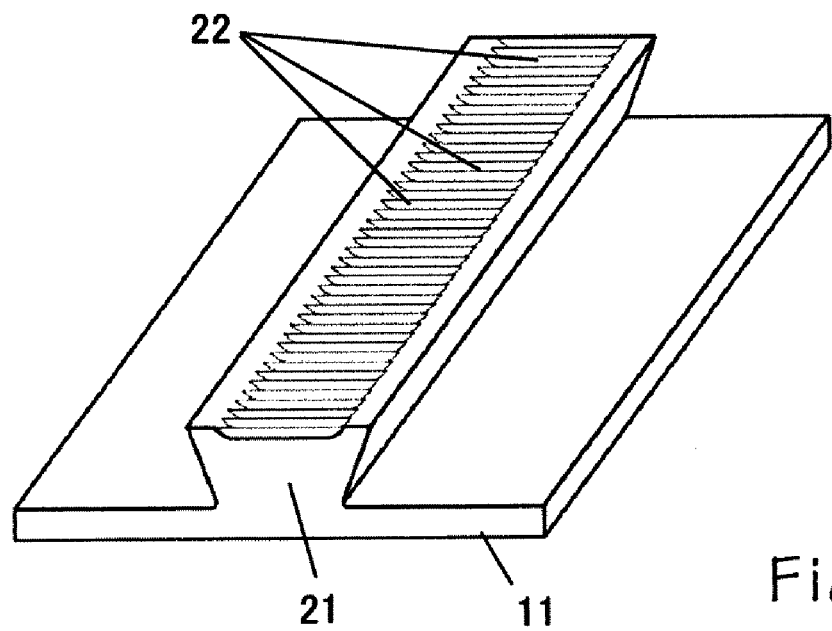
FIG. 2A is a drawing showing a mesa-shaped ridge stripe structure corresponding to the width of the V-grooves.
Figure 2B:
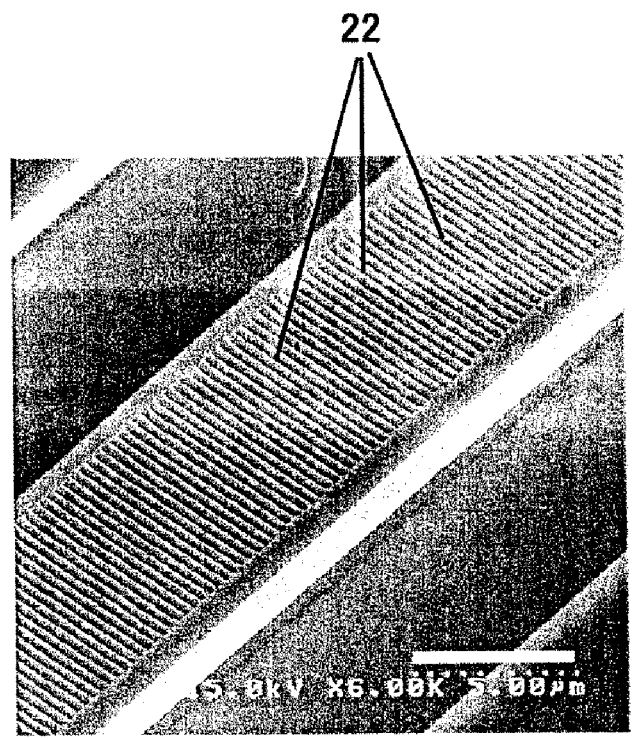
FIG. 2B is a scanning electron micrograph of the principal parts of FIG. 2A

First, with reference to FIG. 2A, finite length V-grooves 22 are formed in the [1-10] direction on a (100) substrate 11 at periods that are integer multiples of ¼ the wavelength in the lasing medium, and a mesa structure (a reverse mesa in this case) is formed in the [110] direction having a width corresponding to that of the V-grooves, thereby forming the stripe-shaped ridge 21. FIG. 2B is a scanning electron micrograph showing the array of V-grooves 22 obtained in the course of the actual fabrication.

Figure 3A:
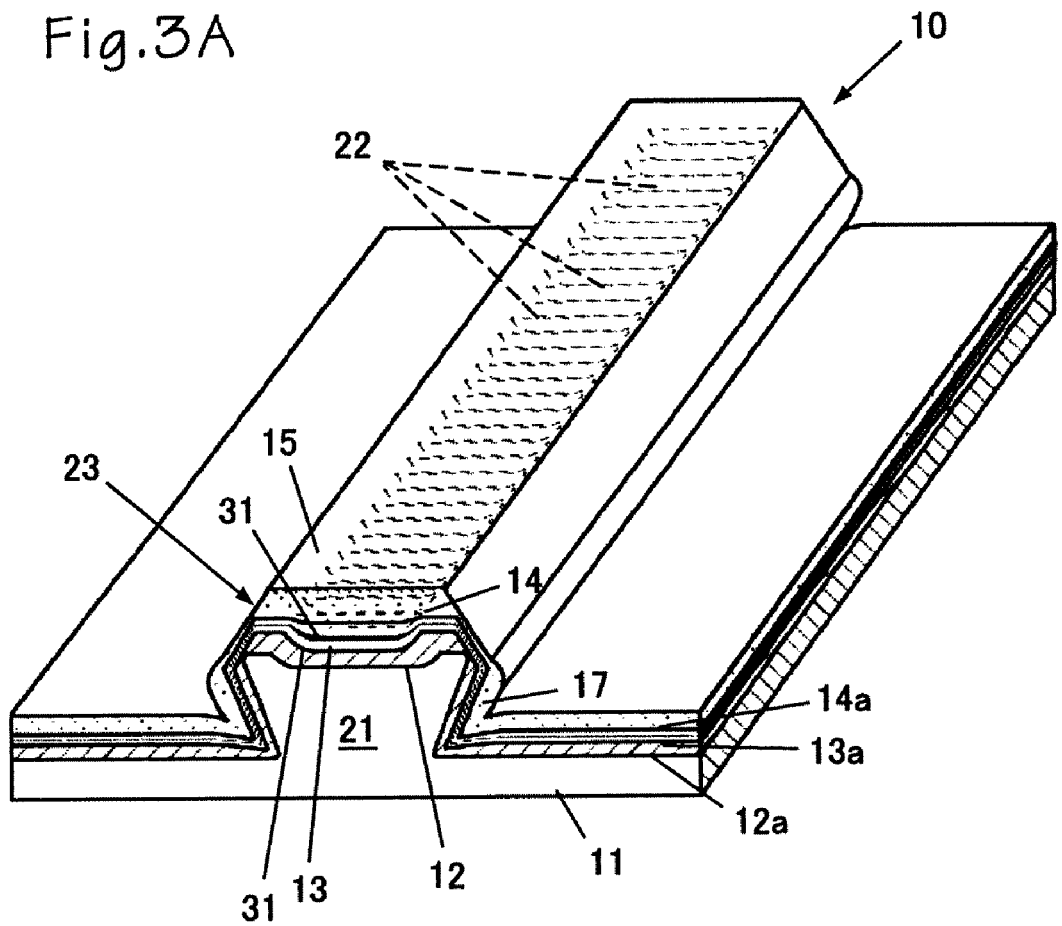
FIG. 3A is a drawing illustrating the optical waveguide on the ridge.
Figure 3B:
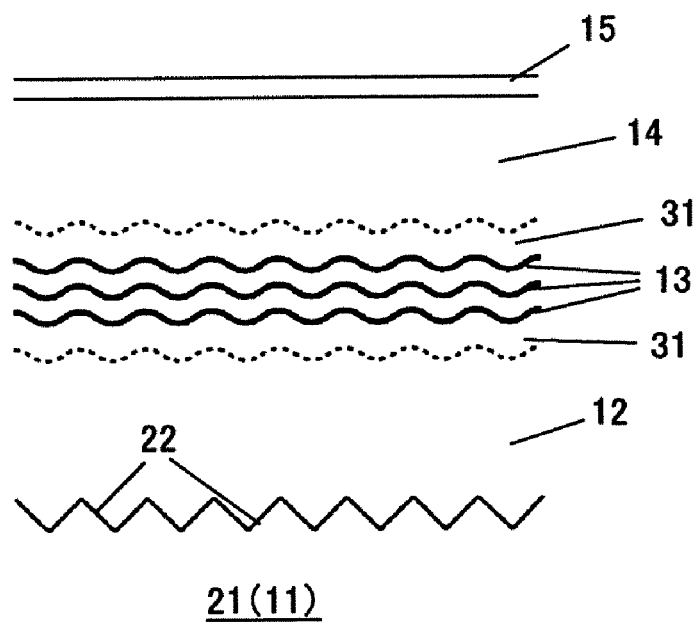
FIG. 3B is a drawing for explaining the layered structure shown in FIG. 3A.

Next, with reference to FIGS. 3A and 3B, an n-type AlGaAs lower cladding layer 12 with an aluminum content in the order of 0.4, a non-doped AlGaAs guide layer 31 with an aluminum content in the order of 0.2, InGaAs quantum wires 13 with an indium content in the order of 0.1 to 0.2, another non-doped AlGaAs guide layer 31 with an aluminum content in the order of 0.2, a p-type AlGaAs upper cladding layer 14 with an aluminum content in the order of 0.4 and a p-type GaAs cap layer 15 are grown, in that order, on the substrate 11. Although the quantum wires 13 are formed in three layers using a known method, such as, for example, the method described in Reference 4, the number of layers can be arbitrarily set as required. FIG. 3 depicts a typical layered relationship for the ridge 21.

Figure 4A:
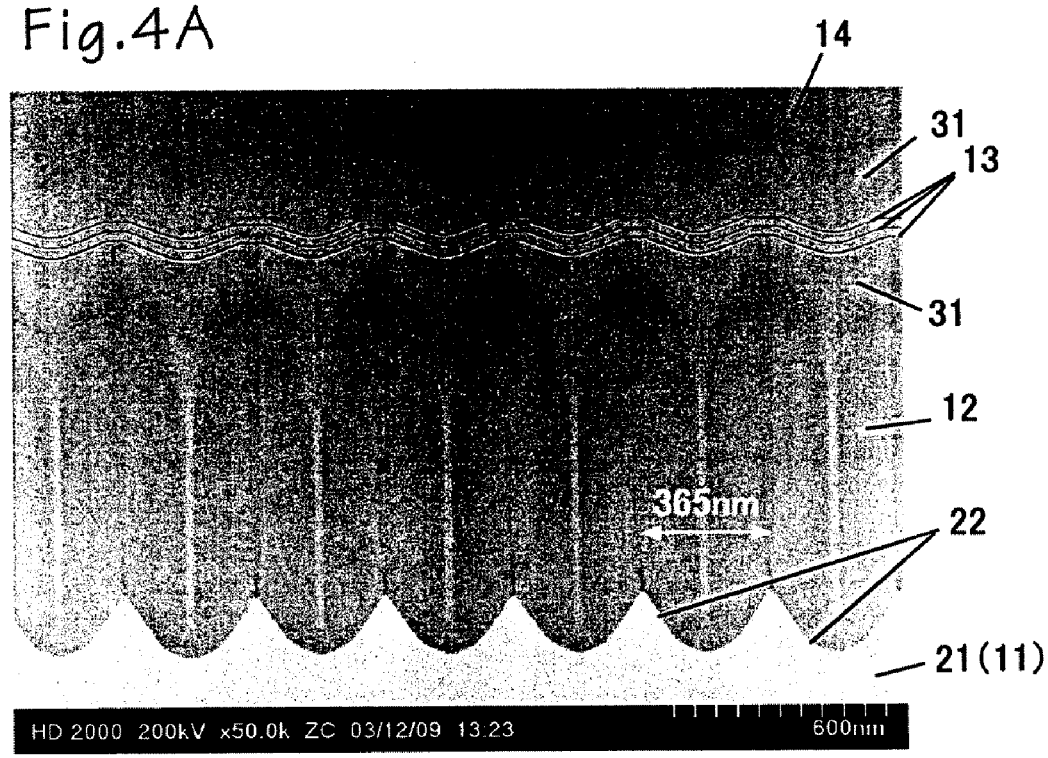
FIG. 4A is a transmission electron micrograph showing a cross-section of the ridge structure.
Figure 4B:
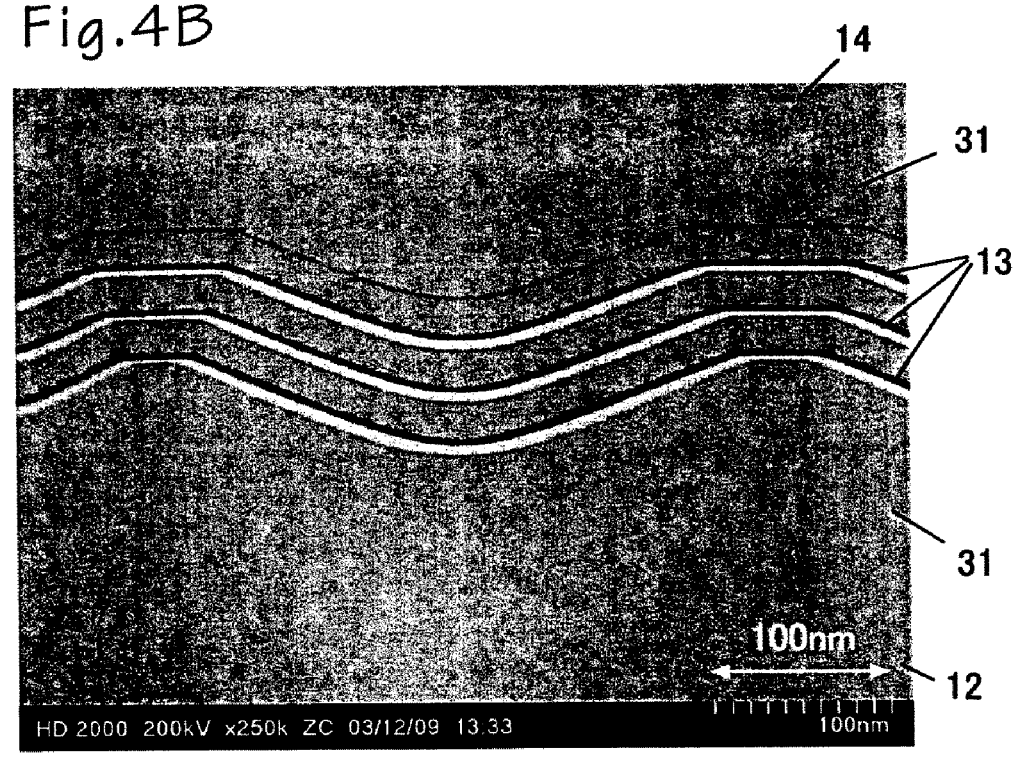
FIG. 4B is an enlargement of the principal parts shown in FIG. 4A.

FIGS. 4A and 4B are cross-sectional transmission electron micrographs of the ridge 21 thus fabricated, with FIG. 4B showing an enlarged view of the principal portion of FIG. 4A. Elements that are the same as those in the other figures described to this point are denoted using the same reference symbols; this also applies with respect to other examples described herein. The shape of the V-grooves on the ridge 21 is well maintained on the upper surface of the lower cladding layer 12, which is about 1 μm thick, on which the non-doped AlGaAs guide layer 31 and the curved InGaAs quantum wires 13 are formed. The sidewall is then covered with a layer of polyimide and electrodes are formed, completing the manufacture of the quantum nanostructure semiconductor laser 10 of the invention, shown in FIG. 1A, as a distributed feedback semiconductor laser.

The structure disclosed in Reference 5 (not yet public knowledge) also has a periodic array of finite length quantum wires 13 with closed ends, suppressing the lateral diffusion of minority carriers. However, in the case of the present invention the lateral confinement is strengthened by the slower growth rate on the (111) plane of the sidewall. Moreover, because the optical waveguide is naturally shaped by the crystal growth process, lasing is possible at a lower threshold than in the prior art and, this can be achieved by a simpler process comprising preparation of patterned substrate, one-time growth, and electrode formation.

Figure 5A:
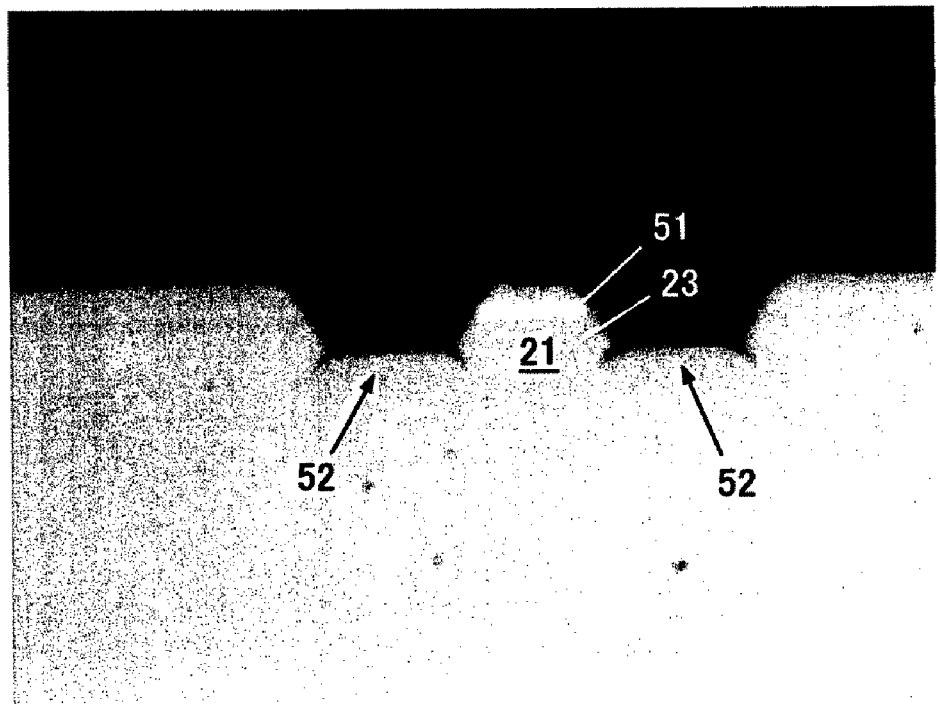
FIG. 5A is an infrared electron micrograph showing an example of the emission distribution of a DFB quantum nanostructure semiconductor laser with a ridge waveguide according to the invention.
Figure 5B:
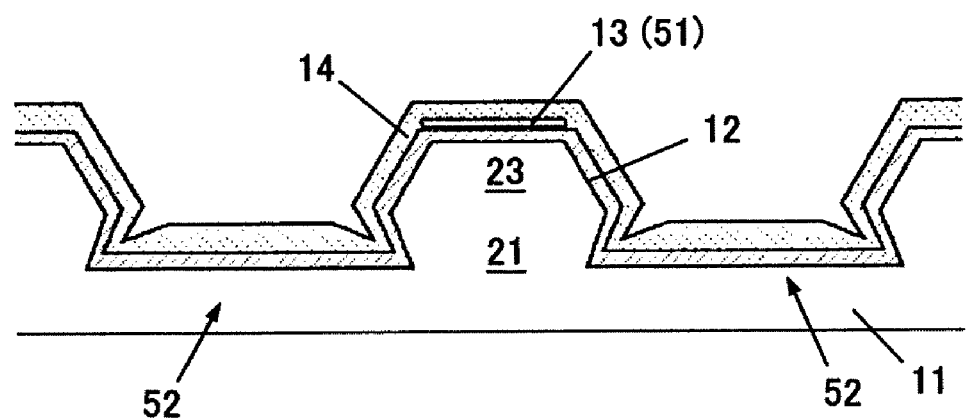
FIG. 5B is a drawing for explaining the parts shown in FIG. 5A.

The use of a GaAs (100) substrate is not imitative; instead, the V-grooves can also be formed in the [01-1] direction on a GaAs (311)A substrate, GaAs or InGaAs quantum wires 13 can be formed on the substrate, and finite length InGaAs quantum wires 13 can be formed in the [01-1] direction on an InP (100) or (311) substrate. FIG. 5A is an infrared micrograph of a near field image of an example of the DFB semiconductor laser 10 with a ridge waveguide, manufactured according to the present invention; FIG. 5B is a drawing for explaining FIG. 5A. Emission portion 51 is limited to the active region formed by the quantum wires, effectively concentrating the current. As shown in the drawings, the ridge 21 can be formed on the substrate as a structure between double channels 52, a structure that has the advantage of being easy to planarize.

Figure 6:
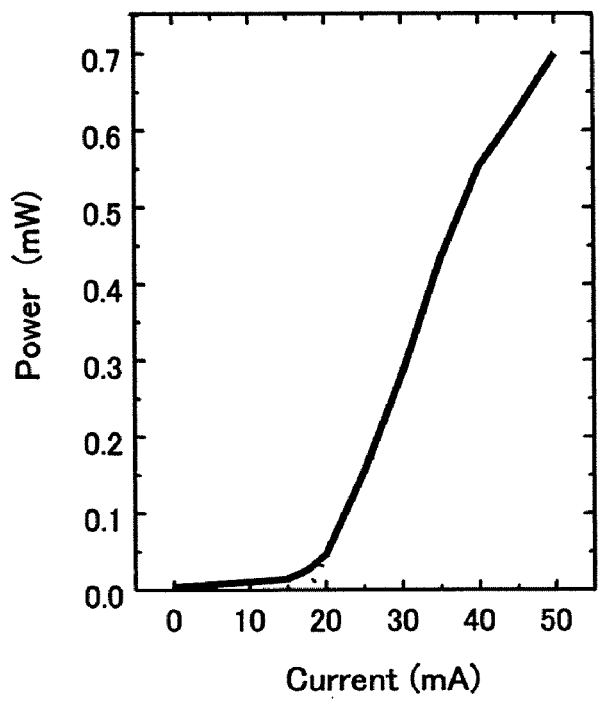
FIG. 6 shows the current vs. light output characteristics of the device shown in FIG. 5A.
Figure 7:
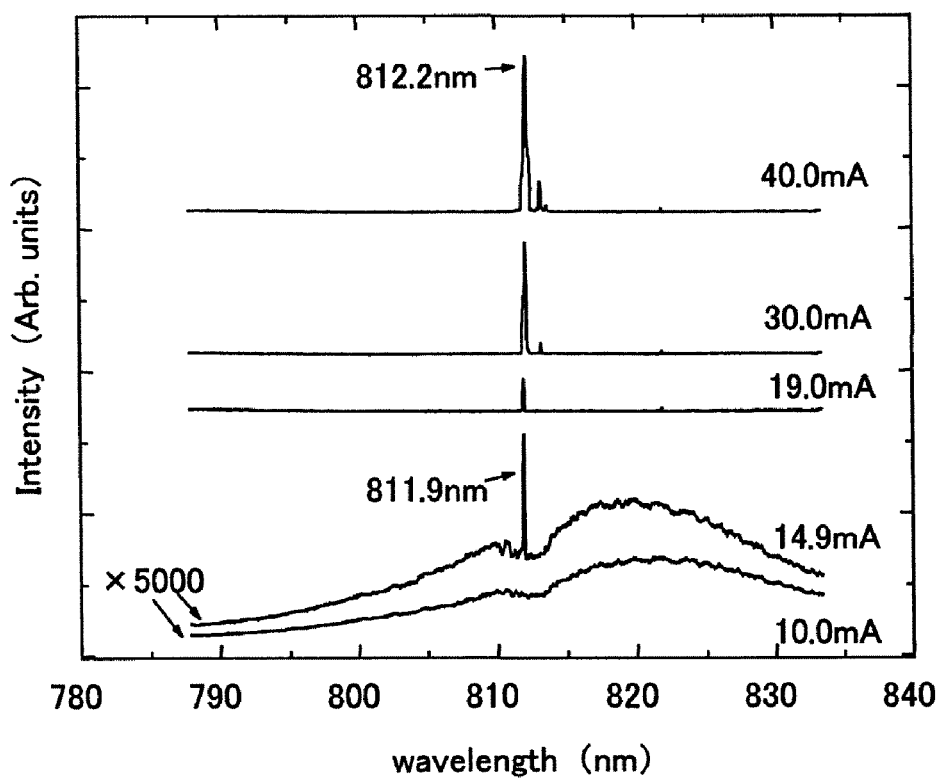
FIG. 7 shows the lasing spectrum of the device of FIG. 5A.

FIG. 6 shows an example of the current vs. light output characteristics of the device of FIG. 5A. The threshold current is 15 mA, being about half the 28 mA obtained by the present inventors using the structure described in Reference 5. FIG. 7 shows the lasing spectrum of the device of FIG. 5A. As can be seen, a stable single longitudinal mode was obtained until up to around three times the threshold value.

Instead of the ridge substrate (substrate with ridge 21) described so far, it is possible to use a substrate 11 with a stripe-shaped window that exposes a compound semiconductor layer and extends in a direction of laser beam emission, the window being formed in a dielectric layer formed on a compound semiconductor substrate or located between dielectric layers, such as described in Reference 7.

Figure 8:
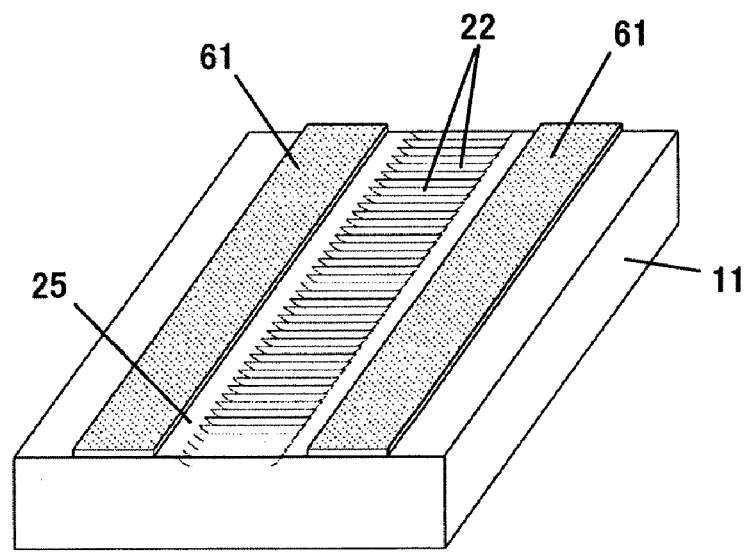
FIG. 8 is an explanatory drawing illustrating the initial step of manufacturing a quantum nanostructure semiconductor laser according to a second embodiment of the invention.
Figure 9:
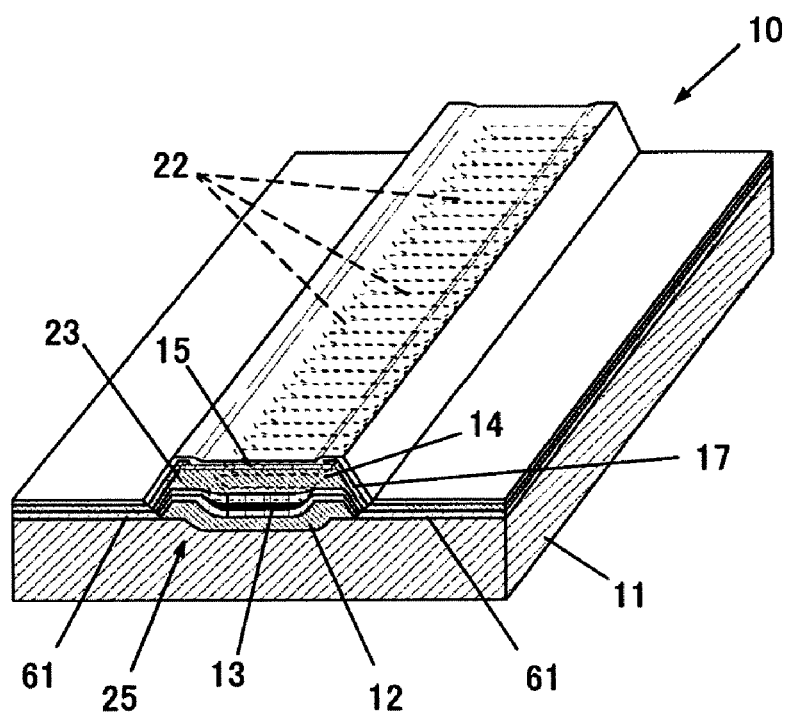
FIG. 9 is a drawing illustrating the structure of the quantum nanostructure semiconductor laser according to the second embodiment of the invention.

Such a configuration is shown in FIG. 8. A pair of dielectric stripes 61 is formed on the compound semiconductor substrate 11. On the surface of the substrate 11 in the stripe-shaped window 25 is a plurality of parallel V-grooves 22 arrayed lengthwise along the window (in the direction of laser beam emission), with each V-groove extending orthogonally to the direction of laser beam emission. This structure can be achieved by, for example, forming a dielectric film and then using an electron beam exposure machine, i-line stepper or excimer laser stepper or the like to form the finite length stripe-shaped window 25. After using wet etching to form the V-grooves 22 on the substrate 11, two stripe-shaped portions are protected by a photoresist and the unnecessary areas of the dielectric film are removed by dry or wet etching. Films are then epitaxially grown, as shown in FIGS. 3 and 4, to produce the quantum nanostructure semiconductor laser 10 according to the second embodiment of the invention shown in FIG. 9. One-time selective crystal growth is used to form an optical waveguide on the window 25. The waveguide includes at least an upper cladding layer 14, a plurality of quantum wires 13, an upper cladding layer 14, and in this case a cap layer 15, formed in that order, and self-organizes into a trapezoidal shape. The waveguide sidewall, from the height of the quantum wires 13, is exposed or covered only by an insulation layer. When a dielectric mask is used, due to irregularities at the edge of the mask and the effect of polycrystals produced on the mask, interface smoothness is inferior to that in embodiments that use the ridge 21. However, an advantage of using a dielectric mask is that it offers high reproducibility of the substrate shape, since the deep wet etching process can be omitted. Instead of the window 25 being disposed between the pair of dielectric stripes 61, the window 25 can be formed in a dielectric layer.

While any material that enables the structure of the invention to be realized may be used, but growing InGaAs or InAs to or above a critical film thickness on the V-grooves enables a plurality of InGaAs or InAs quantum dots to be formed on the V-groove bottoms. While not illustrated, this is a modified version of the structures of the first and second embodiments that constitutes third and fourth embodiments. The quantum dots constitute a structure that is utilized as the laser active region, strengthening the current confinement effect. In the case of this structure too, it is desirable for the V-groove substrate to be a GaAs (100) or (311)A substrate or an InP (100) or (311)A substrate.

The high-speed modulation of a direct-current-driven semiconductor laser is limited by the relaxation oscillation frequency, and frequency chirping during modulation is also a problem. Therefore, in the conventional methods at operating speeds of 40 GHz or above, the semiconductor laser output in the continuous wave mode is intensity-modulated or phase-modulated using an external or adjacent modulator. The quantum nanostructure semiconductor laser according to the present invention is suitable for constructing a hybrid modulator type semiconductor laser, due to the low electrostatic capacity of the laser and the absence of lateral conduction along the current blocking layer.

Figure 10:
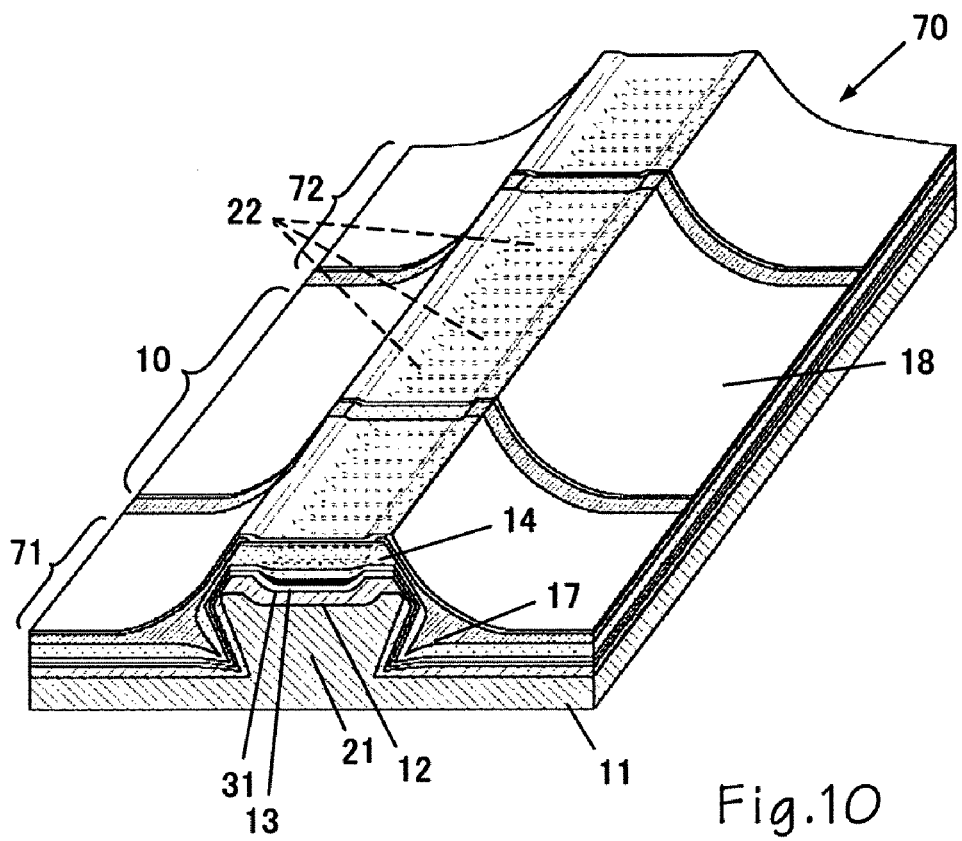
FIG. 10 is a drawing showing the quantum nanostructure semiconductor laser according to the invention that includes a modulator.

For example, as shown in FIG. 10, a DFB semiconductor laser 70 with modulators can be constructed by adding two modulators 71 and 72 to the DFB semiconductor laser 10 of this invention, one at each end in the direction in which the laser beam is emitted, producing two beams having high mutual coherency. Setting the first modulator 71 to frequency f1 and the second modulator to frequency f2 makes it possible to emit two coherent beams having different frequencies, which is a requirement for an optical heterodyne modulation/demodulation system. The configuration of the modulation portion itself is public knowledge, and may be constituted using the type of electro-absorption effect device disclosed by JP-B HEI 7-32279 (Reference 11) or the Mach-Zehnder type modulator described in Japanese Patent No. 2817602 (Reference 12).

In addition to the above, a mode-locked semiconductor laser can be realized by isolating the electrode 18 in the center part of the DFB semiconductor laser 10 with ridge waveguide, and providing a saturable absorber there. With further respect to mode-locking, as described in Japanese Patent No. 3338869 (Reference 13), intentionally displacing the periods of the V-grooves 22 so they are not integer multiples of ¼ the wavelength in the lasing medium makes it possible to compensate for dispersion between lasing modes, which can be used in the quantum nanostructure semiconductor laser of the invention to enable wideband wavelength oscillation and short-pulse oscillation in a mode-locked state, and also to stabilize the waveguide mode.

Figure 11:
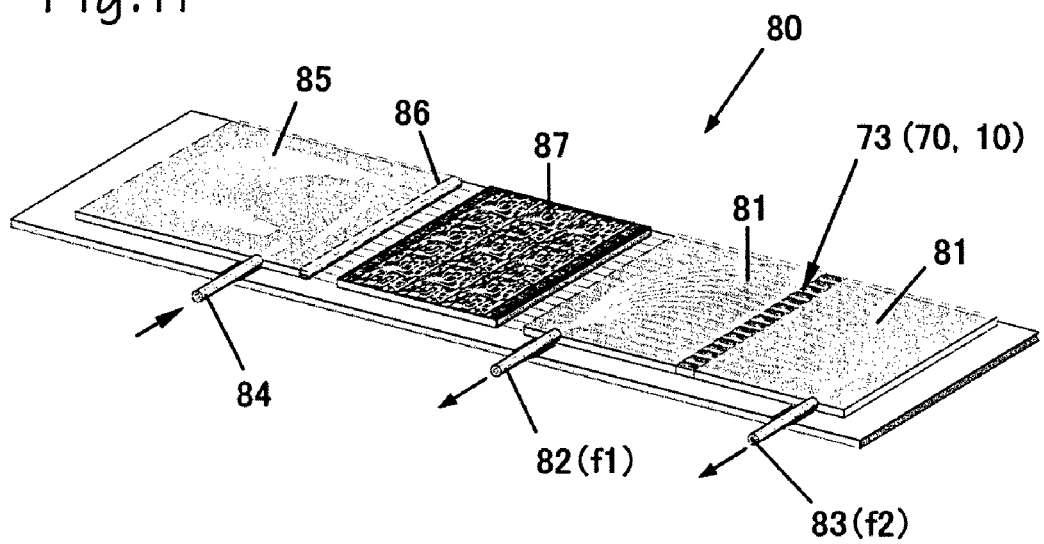
FIG. 11 is a drawing of a multi-wavelength heterodyne modulation/demodulation module configured using the quantum nanostructure semiconductor laser of the invention.

Examples of significant applications of the quantum nanostructure semiconductor laser 10 according to the invention will now be described. FIG. 11 shows an example of a multi-wavelength heterodyne modulation/demodulation hybrid module 80. Here, as shown in FIG. 10, a modulator 71 is added to one end and a modulator 72 to the other end of the DFB quantum nanostructure semiconductor laser 10 shown in FIGS. 1 and 9, to form a modulator-equipped DFB semiconductor laser 70; this configuration uses an array of a plurality of the modulator-equipped DFB semiconductor lasers 70. For convenience, this structure is called a multi-wavelength modulator array 73.

The modulators of each modulator-equipped DFB semiconductor laser 70 are connected via optical splitters 81 to a pair of output optical fibers 82 and 83 that handle frequencies f1 and f2, respectively. Via an array type wavelength splitter 85, a light receiving fiber 84 is connected to a gated optical detector array 86 that uses an optical detector element disclosed by Patent Application No. 2004-5580 (Reference 14), and the received optical signal is processed by the optical detector array 86 and the multi-wavelength modulator array 73, which are connected by a modulation/demodulation integrated circuit 87, to thereby control the operation of the multi-wavelength modulator array 73.

Figure 12:
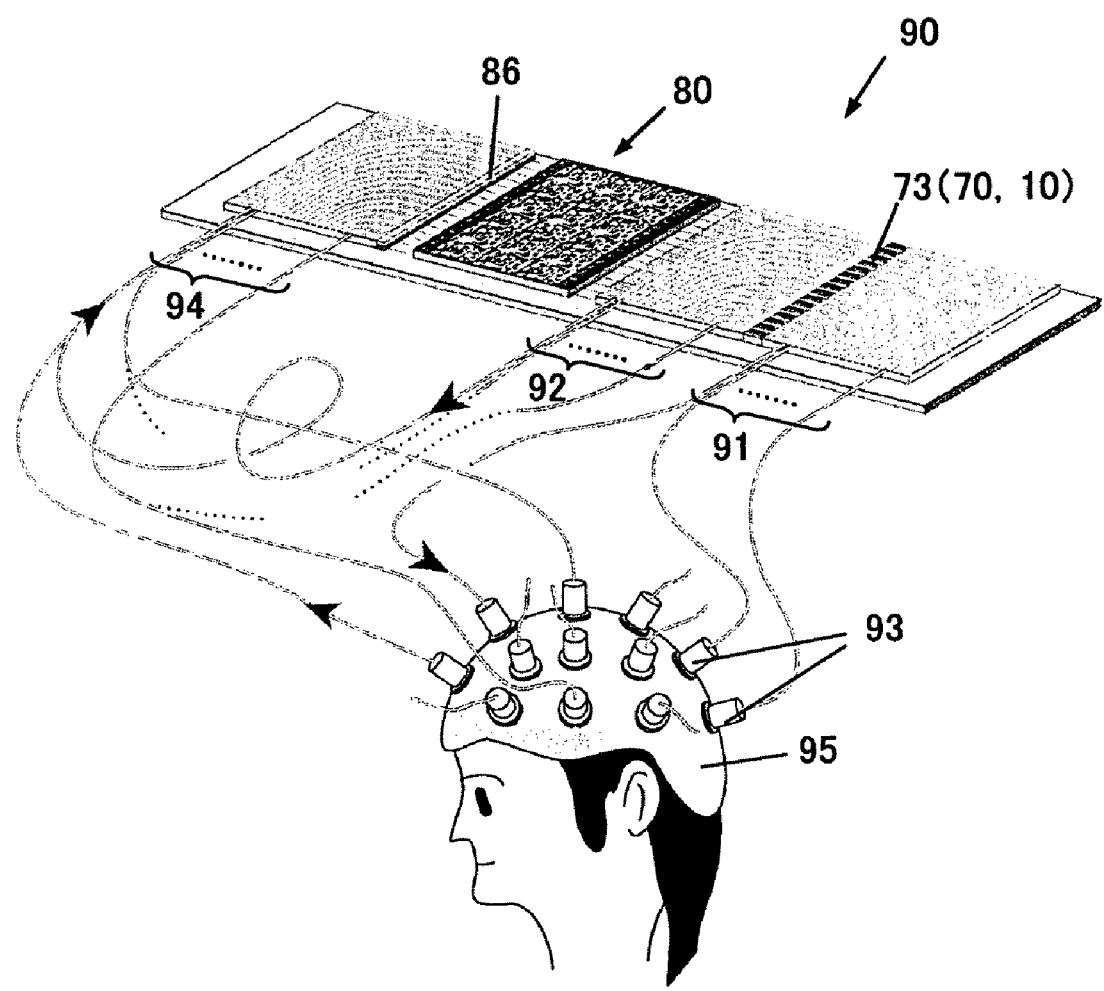
FIG. 12 is a drawing of a diffuse optical tomography apparatus configured using the quantum nanostructure semiconductor laser of the invention.

Various applications are possible for the multi-wavelength heterodyne modulation/demodulation module 80. FIG. 12 shows an example of the module 80 applied to a diffuse optical tomography apparatus 90. Light output from the array 73 passes through a group of optical output fibers 91 and is projected onto a test specimen 95 (a person's head, in this case) via optical fiber collimators 93. Light that is reflected or transmitted is collected by the collimators 93 and, after being combined with the light from another group of output optical fibers 92, is guided from receiving optical fibers 94 to the optical detector array 86.

As described in "Non-invasive imaging of higher brain functions," Koizumi, et al., vol. 87, No. 3, pp 207-214, Journal of the Institute of Electrical Communication Engineers of Japan (Reference 15), this medical electronics technology is attracting attention as a method of using near-infrared light topography to clarify brain surface activity. Previously, when this technology utilized electrical lock-in amplifiers for detecting such activity, noise generated by the optical detectors, and the fact that the apparatus was not portable, since it used tens of amplifiers, made it difficult to apply in an actual clinical environment.

In contrast, simple systems that utilize light to observe functions in living organisms are now reaching the market. These use one to several channels to monitor brain oxygen levels and blood flow during operations. In accordance with the type of inventive technology shown in FIG. 12, if the module 80 could be used to realize a compact, coherent three-dimensional optical tomography apparatus with about a hundred channels, it would be a major contribution to clinical medical treatment.

Because light emitted by each of the individual quantum nanostructure semiconductor lasers 10 making up a laser array can be distinguished by modulation frequency or bit modulation encoding, multichannel measurement does not necessarily require that wavelengths be changed. However, since the optical absorption spectra of hemoglobin change according to the oxygen adsorption state, an effective application would be to use two lasers having wavelengths of 780 nm and 830 nm and compare spectral changes at those wavelengths. In this case, the fact that regrowth is not required in the case of the DFB semiconductor laser according to the present invention makes it possible to use AlGaAs (in which oxidation gives rise to problems), which is particularly useful in the above wavelength regions.

There are a diverse range of other applications for the quantum nanostructure semiconductor laser of the invention, including other medical electronic apparatuses, optical routers, and the development of optical networks that have to be constructed.

It should be noted that the present invention is in no way limited to the details of the described embodiments but that changes and modifications may be made that do not depart from the scope of the appended claims.

What is claimed is:

1. A quantum nanostructure semiconductor laser, comprising:

a stripe-shaped ridge having a plurality of V-grooves formed on a compound semiconductor substrate in a direction of laser beam emission, the V-grooves being arrayed in parallel along a surface of the ridge in the direction of laser beam emission, with each V-groove extending orthogonally to the direction of laser beam emission; and an optical waveguide having a trapezoidal shape bounded by higher index crystalline planes on the ridge and that includes a lower cladding layer, a plurality of quantum wires and an upper cladding layer formed in order, each of the plurality of quantum wires being formed to a finite length corresponding to the width of a stripe-shaped ridge, wherein the quantum wires do not project out beyond a width of the ridge, but ends of the quantum wires are converged and closed off with the upper and lower cladding layers toward the higher index crystalline planes to provide a high lateral confinement offset.

2. A quantum nanostructure semiconductor laser, comprising:

a stripe-shaped window that exposes a compound semiconductor layer and extends in a direction of laser beam emission, the window being formed in a dielectric layer formed on the compound semiconductor substrate or located between dielectric layers;

a plurality of V-grooves on a surface of the compound semiconductor substrate surface exposed by the window, the V-grooves being arrayed in parallel along the surface of the semiconductor substrate in the direction of laser beam emission with each V-groove extending orthogonally to the direction of laser beam emission; and an optical waveguide having a trapezoidal shape bounded by higher index crystalline planes and that includes a lower cladding layer, a plurality of quantum wires and an upper cladding layer formed in order, each of the plurality of quantum wires being formed to a finite length corresponding to the width of a striped-shaped window, wherein the quantum wires do not project out beyond a width of the window, but ends of the quantum wires are converged and closed off with the upper and lower cladding layers toward the higher index crystalline planes to provide a high lateral confinement offset.

3. A quantum nanostructure semiconductor laser, comprising:

a stripe-shaped ridge having a plurality of V-grooves formed on a compound semiconductor substrate in a direction of laser beam emission, the V-grooves being arrayed in parallel along a surface of the ridge in the direction of laser beam emission, with each V-groove extending orthogonally to the direction of laser beam emission; and an optical waveguide having a trapezoidal shape bounded by higher index crystalline planes on the ridge and that includes a lower cladding layer, a plurality of quantum dots grown to or above a critical film thickness and an upper cladding layer formed in order, each of the plurality of quantum dots being formed at a location corresponding to a V-groove within the width of a stripe-shaped ridge, wherein a laser active region does not project out beyond a width of the ridge, but ends of the laser active region are converged and closed off with the upper and lower cladding layers toward the higher index crystalline planes to provide a high lateral confinement offset.

4. A quantum nanostructure semiconductor laser, comprising:

a stripe-shaped window that exposes a compound semiconductor layer and extends in a direction of laser beam emission, the window being formed in a dielectric layer formed on a surface of the compound semiconductor substrate or located between dielectric layers;

a plurality of V-grooves on the surface of the compound semiconductor substrate exposed by the window, the V-grooves being arrayed in parallel along the surface of the compound semiconductor substrate in the direction of laser beam emission, with each V-groove extending orthogonally to the direction of laser beam emission; and an optical waveguide having a trapezoidal shape bounded by higher index crystalline planes and that includes a lower cladding layer, a plurality of quantum dots grown to or above a critical film thickness and an upper cladding layer formed in order, each of the plurality of quantum dots being formed at a location corresponding to a V-groove location within the width of a stripe-shaped window, wherein the a laser active region does not project out beyond a width of the window, but ends of the laser active region are converged and closed off with the upper and lower cladding layers toward the higher index crystalline planes to provide a high lateral confinement offset.

* * * * *